United States Patent
Gleason et al.

(10) Patent No.: US 7,112,615 B2
(45) Date of Patent: Sep. 26, 2006

(54) POROUS MATERIAL FORMATION BY CHEMICAL VAPOR DEPOSITION ONTO COLLOIDAL CRYSTAL TEMPLATES

(75) Inventors: Karen K. Gleason, Lexington, MA (US); Qingguo Wu, Tualatin, OR (US); April Ross, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 35 days.

(21) Appl. No.: 10/624,959

(22) Filed: Jul. 22, 2003

(65) Prior Publication Data

US 2004/0249006 A1 Dec. 9, 2004

Related U.S. Application Data

(60) Provisional application No. 60/397,747, filed on Jul. 22, 2002.

(51) Int. Cl.
*C08J 9/26* (2006.01)
(52) U.S. Cl. .................. 521/77; 438/409; 438/781; 438/778; 438/780; 438/782; 438/960
(58) Field of Classification Search .............. 521/77; 438/409, 780, 781, 782, 778, 960
See application file for complete search history.

(56) References Cited

U.S. PATENT DOCUMENTS

| | | | |
|---|---|---|---|
| 4,599,243 A | 7/1986 | Sachdev et al. | |
| 5,521,126 A | 5/1996 | Okamura et al. | |
| 5,852,088 A | 12/1998 | Dismukes et al. | |
| 6,068,884 A | 5/2000 | Rose et al. | |
| 6,090,724 A | 7/2000 | Shelton et al. | |
| 6,107,357 A | 8/2000 | Hawker et al. | |
| 6,214,746 B1 | 4/2001 | Leung et al. | |
| 6,258,735 B1 | 7/2001 | Xia et al. | |
| 6,261,469 B1 | 7/2001 | Zakhidov et al. | |
| 6,313,045 B1 | 11/2001 | Zhong et al. | |
| 6,319,858 B1 | 11/2001 | Lee et al. | |
| 6,358,863 B1 | 3/2002 | Desu et al. | |
| 6,391,932 B1 | 5/2002 | Gore et al. | |
| 6,399,666 B1 | 6/2002 | Hawker et al. | |
| 6,413,882 B1 | 7/2002 | Leung et al. | |
| 6,420,441 B1 | 7/2002 | Allen et al. | |
| 6,455,443 B1 | 9/2002 | Eckert et al. | |
| 6,495,479 B1 | 12/2002 | Wu et al. | |
| 6,541,367 B1 | 4/2003 | Mandal | |
| 6,541,865 B1 | 4/2003 | Hawker et al. | |
| 2001/0004479 A1 | 6/2001 | Cheung et al. | |
| 2002/0042657 A1 | 4/2002 | Pugh et al. | |
| 2002/0062782 A1 | 5/2002 | Norris et al. | |
| 2002/0137359 A1 | 9/2002 | Grill et al. | |
| 2003/0001239 A1 | 1/2003 | Gallahger et al. | |
| 2003/0006477 A1 | 1/2003 | Gallahger et al. | |

FOREIGN PATENT DOCUMENTS

| | | |
|---|---|---|
| EP | 1 148 539 A2 | 10/2001 |
| EP | 1 195 451 A1 | 4/2002 |
| EP | 1 321 976 A2 | 6/2003 |
| WO | WO 01/86038 A2 | 11/2001 |
| WO | WO 01/96635 A2 | 12/2001 |
| WO | WO 03/005429 A1 | 1/2003 |

OTHER PUBLICATIONS

Lanata, M. et al. "Titania Inverse Opals For Infrared Optical Applications" Optical Materials, vol. 17, pp. 11-14 (2001).
Yan, Hongwei et al. "Influence of Processing Conditions On Structures of 3D Ordered Macroporous Metals Prepared by Colloidal Crystal Templating" Chem. Mater., vol. 13, pp. 4314-4321 (2001).
Baklanov, M.R. et al. "Comparative Study of Porous SOG Films With Different Non-Destructive Instrumentation," IEEE pp. 189-191, (2001).
Barklanov, M.R. "Determination of Pore Size Distribution In Thin Films By Ellipsometric Porosimetry" J. Vac. Sci. Technol. B., vol. 18, No. 3, pp. 1385-13981, (2000).
Baklanov, M.R., Mogilnikov, K.P., "Non-Destructive Characterisation of Porous Low-K Dielectric Films," Microelectronic Engineering, vol. 64, pp. 335-349, (2002).
Chen, J.Y. et al. "Microstructure and Mechanical Properties of Surfactant Templated Nonporous Silica Thin Films Effect of Methylsilylation," Journal of The Electrochemical Society, vol. 150, No. 6, pp. F123-F127 (2003).
Grill, A. and Neumayer, D. A. "Structure of Low Dielectric Constant To Extreme Low Dielectric Constant SiCOH Films: Fourier Transform Infrared Spectroscopy Characterization," Journal of Applied Physics, vol. 94, No. 10, pp. 6697-6707 (2003).

(Continued)

Primary Examiner—Iina S. Zemel
(74) Attorney, Agent, or Firm—Thomas J. Engellenner; Deborah A. Miller; Nutter McClennen & Fish LLP

(57) ABSTRACT

Methods and systems are disclosed for fabricating ultra-low dielectric constant porous materials. In one aspect of the invention, a method for making porous low-k films is disclosed. The method uses polymer based porogens as sacrificial templates around which a chemical vapor deposition (CVD) or plasma enhanced chemical vapor deposition (PECVD) deposited matrix is formed. Upon pyrolysis, the porogens decompose resulting in a porous ultra-low dielectric material. This method can be used, for example, to produce porous organosilicate glass (OSG) materials, ultra-low dielectric nanoporous materials, porous ceramics, porous scaffolds, and/or porous metals. Various uses and embodiments of the methods and systems of this invention are disclosed.

42 Claims, 7 Drawing Sheets

OTHER PUBLICATIONS

Grill, A. and Patel, V. "Ultralow-k Dielectrics Prepared By Plasma-Enhanced Chemical Vapor Deposition," Applied Physics Letters, vol. 79, No. 6, pp. 803-805 (2001).

Grill, A. "Plasma Enhanced Chemical Vapor Deposited SiCOH Dielectrics: From Low-k To Extreme Low-k Interconnect Materials," Journal of Applied Physics, vol. 93, No. 3, pp. 1785-1790 (2003).

Grill, A et al. "Characteristics of Low-k and Ultralow-k PECVD Deposited SiCOH Films," Mat. Res. Soc. Symp. Proc., vol. 716, pp. B12.3.1-B12.3.6 (2002).

Grill, A. et al. "Porosity In Plasma Enhanced Chemical Vapor Deposited SiCOH Dielectrics: A Comparative Study," Journal of Applied Physics, vol. 94, No. 5, pp. 3427-3435, (2003).

Grill, A. and Patel, V. "Low Dielectric Constant Films Prepared By Plasma-Enhanced Chemical Vapor Deposition From Tetramethylsilane," Journal of Applied Physics, vol. 85, No. 6 pp. 3314-3318 (1999).

Hendrick, J. L. et al. "Templating Nanoporosity In Thin-Film Dielectric Insulators," Adv. Mater. vol. 10, No. 13 pp. 1049-1053 (1998).

Park, S.H. and Xia, Y. "Macroporous Membranes With Highly Ordered And Three-Dimensionally Interconnected Spherical Pores," Advanced Materials, vol. 10, No. 13, pp. 1045-1053 (1998).

Peters, L. "Low-K Dielectrics: Will Spin-On or CVD Prevail?," Semiconductor international, pp. 108-124, (2000).

Peters, L. "Removing Barriers To Low-K Dielectric Adoption," Semiconductor International 53-62, (2002).

Sanchez, M.I. et al. "Nanofoam Porosity By Iinfrared Spectroscopy," Journal of Polymer Science: Part B: Polymer Physics, vol. 33, pp. 253-257 (1995).

Sanchez, M.I. et al. "Nanofoam Porosity Measured By Infrared Spectroscopy And Refractive Index," Mat. Res. Soc. Symp. Proc., vol. 431, pp. 475-480 (1996).

Vrtis, R.N. et al. "Plasma Enhanced Chemical Vapor Deposition of Porous Organosilicate Glass ILD Films With $k \leq 2.4$.," Mat. Res. Soc. Symp. Proc., vol. 766, pp. E7.4.1-E7.4.6, (2003).

Wu, Q. and Geason, K.K. "Plasma-Enhanced Chemical Vapor Deposition of Low-k Dielectric Films Using Methylsilane, Dimethylsilane, and Trimethylsilane Precursors," J. Vac. Sci. Technol., vol. A 21, No. 2, pp. 388-393 (2003).

Yang, S. et al. "Nanoporous Ultralow Dielectric Constant Organosilicates Templated By Triblock Copolymers," Chem. Mater., vol. 14, pp. 369-374 (2002).

Yim, J-H. et al. "The Preparation and Characterization of Small Mesopores In Siloxane-Based Materials That Use Cyclodextrins as Templates," Adv. Funct. Mater., vol. 13, No. 5, pp. 382-386 (2003).

Ye, Y-H. et al. "Large-Scale Ordered Macroporous $SiO_2$ Thin Films by a Template-Directed Method," Applied Physics Letters, vol. 81, No. 4, pp. 616-618, (2002).

Zhang, P. et al. "Theory of Metastable Group-IV Alloys Formed From CVD Precursors," Physical Review B, vol. 64, pp. 235201-1-235201-10 (2001).

— 100 nm

— 8 nm

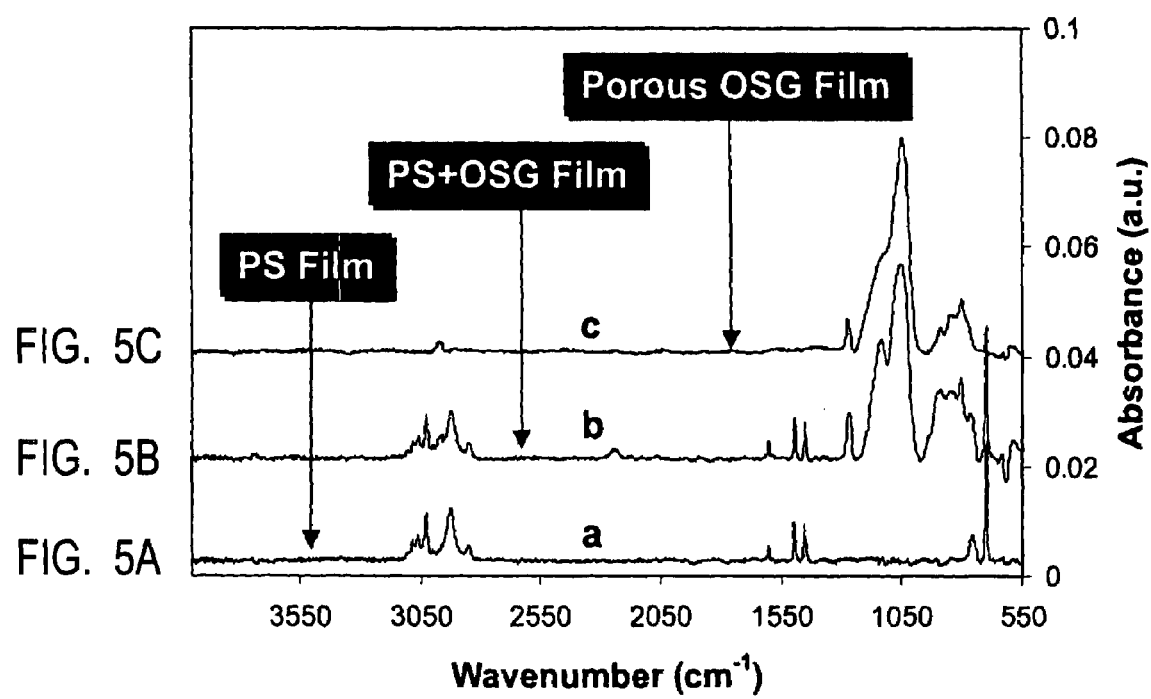

POROUS MATERIAL FORMATION BY CHEMICAL VAPOR DEPOSITION ONTO COLLOIDAL CRYSTAL TEMPLATES

REFERENCE TO RELATED APPLICATIONS

The present invention claims priority to U.S. Provisional Application No. 60/397,747 filed Jul. 22, 2002.

BACKGROUND OF THE INVENTION

The technical field of the invention is chemical vapor deposition of materials and, in particular, the formation of porous materials for use in electronic devices and other applications.

In the attempt to increase processor speeds and to make more powerful microelectronic devices, semiconductor manufacturers seek to reduce the size of microchips. However, as chip sizes decrease, their circuitry gets closer together and the operating frequencies increase, which dramatically amplifies the problems of electrical interference between circuit elements, known as cross-talk. Additionally, as transistors shrink and the total amount of interconnect circuitry continues to increase, delays in the wiring become more important to circuit performance. Intermetal dielectric materials, which provide insulation between circuits, also affect the capacitance of the circuit and contribute to interconnect delays. Thus, improved dielectric materials with lower K values are desired to reduce the noise, preserve the signal, conserve power, and reduce the interconnect delay (ICD) so that microelectronics can continue to become both faster and smaller.

Dielectric materials should have excellent thermal stability and mechanical properties without compromising their insulating barrier properties. Current semiconductor processes rely heavily on the use of silicon dioxide ($SiO_2$) as the interlevel dielectric material, which has a dielectric constant of approximately 4.0. Few materials are currently known that have dielectric constants less than 2.0 and are compatible with semiconductor manufacturing requirements, such as thermal stability of at least 400° C. Polytetrafluoroethylene (PTFE), for example, has a low dielectric constant, but is not thermally stable above 300–350° C., which restricts its use in integrated circuits. The industry has only recently begun explore alternative dielectrics.

One approach to finding better dielectric materials has been to introduce nanometer sized holes into a material with an already low dielectric constant, such as $SiO_2$ or poly (methylsilsesquioxane). Since air has κ of 1.0, the addition of pores decrease the overall dielectric constant of the porous material as a function of the level of porosity or density. Porous nanostructured materials find important uses in a broad range of fields including photonics, catalysis, and microelectronics. However, many of the current methods for the production of porous films utilize wet chemistry steps and require a spin-on process to deposit the dielectric material. The use of a spin-on process to fabricate porous thin films has numerous disadvantages, including incompatibility with the other vacuum-based processes used in semiconductor fabrication, environmentally dangerous reagents, and production of large amounts of solvent/material waste. In addition, studies have shown that low dielectric materials that are formed using CVD are mechanically more robust and produce better results when used in chemical mechanical polishing (CMP) and flip chip bonding. Hence, methods of producing porous dielectric materials that are compatible with the CVD processes are needed.

Thus, as electronics continue to shrink in size and increase in power, there is an expanding need for new methods of making ultra-low dielectric materials that can be integrated into conventional integrated circuit fabrication procedures while retaining their thermal stability and insulation abilities.

SUMMARY OF THE INVENTION

Methods and systems are disclosed for fabricating ultra-low dielectric constant porous materials. In one aspect of the invention, a method for making porous low-K films is disclosed. The method uses polymer based porogens as sacrificial templates around which a chemical vapor deposition (CVD) or plasma enhanced chemical vapor deposition (PECVD) deposited matrix is formed. Upon pyrolysis, the porogens decompose resulting in a porous ultra-low dielectric material. This method can be used, for example, to produce porous organosilicate glass (OSG) materials, ultra-low dielectric nanoporous materials, porous ceramics, porous scaffolds, and/or porous metals. Various uses and embodiments of the methods and systems of this invention are disclosed.

The invention provides a method of depositing porogens onto a substrate using sequential vacuum deposition such that the density of the porogens can be controlled. In one embodiment, an ultrasonic atomizer can be used to deposit a colloidal suspension of porogens onto a substrate. The colloidal suspension can have up to about 30% solids. The ultrasonic atomizer uses low ultrasonic vibration energy for atomization and allows for pressureless atomization, which is compatible with vacuum-based processes.

In another aspect of the invention, low dielectric porous films are produced using porogens, as the template for the resultant pores, and a CVD deposited bulk matrix that provides the structural rigidity to the film. This method is superior to available methods as no covalent bonding between the porogen and the matrix is required and the pore size and distribution can be controlled. Chemical vapor deposition (CVD) and/or plasma enhanced chemical vapor deposition (PECVD) can be used to deposit the matrix around the porogens comprising a non-collapsing material. Chemical vapor deposition or CVD is a generic name for a group of processes that involve depositing a solid material from a gaseous phase. The porogen deposition and CVD can be performed either sequentially or simultaneously. In one embodiment, the porogen and matrix deposition can be alternated producing a multi-level structure. Once the porogens and surrounding matrix material are deposited, the porogens can be decomposed after an annealing step. The annealing step also cures the matrix phase via a chemical reaction or condensation step, which adds additional strength to the matrix. This vitrification or crosslinking step is a typical network-forming methodology in systems involving OSG precursors as the matrix material.

The use of an all-CVD process versus a spin-on process to fabricate porous thin films has many advantages such as the seamless compatibility with existing tools, lower environmental impact, and less solvent/material waste. The vacuum based CVD processing is solventless, uses less material and reduces worker exposure to harmful chemicals.

CVD precursors can be selected based upon the desired resultant material. In one embodiment, organosilicon precursors are used. Organosilicate glass (OSG) contains only carbon and hydrogen atoms in addition to silicon and oxygen atoms. The resulting OSG films, also called carbon-doped oxides, have a composition of $Si_wC_xO_yH_z$. Chemical vapor deposition (CVD) of SiO$_2$ and organosilicate glass (OSG, Si:O:C:H) are both currently used in the manufacture of interlayer dielectrics. However, fully dense thin CVD OSG films do not inherently have ultra-low dielectric constants. The introduction of a void or pore structure can therefore further reduce the dielectric constant. In another embodiment, ceramic CVD precursors can be used. Porous ceramics can be used, for example, as membranes and catalysts.

In yet another embodiment, metal CVD precursors can be used. Porous metals have many uses such as in high temperature applications, as membranes, and as light weight batteries.

In yet another embodiment, scaffolding precursors can be used. For example, the porous scaffolding hydroxyapatite has many uses in tissue engineering.

The dielectric constant of the resultant porous film is a function of the degree of porosity. In one embodiment, the methods of the present invention can be used to produce OSG films with porosity ranging from 1% to 99%. Preferably, nanoporous films can be produced with greater than 50% porosity, more preferably greater than 75%, most preferably greater than 85%. The introduction of pores reduces the dielectric constant of the resultant film. The methods of the present invention can be used to produce porous materials with a dielectric constant less than 2.7, preferably less than 2, more preferably less than 1.7, more preferably less than 1.5, most preferably less than 1.4.

In another aspect, the methods of the invention can be used in the fabrication of a single-level or multi-level interconnect structure. As chip density increases, a multi-level interconnect structure can be used to decrease size and improve performance. Fabrication of a multi-level interconnect structure utilizes standard metalization processes, which partially wires together the surface components. A layer of porous ultra-low dielectric material of the present invention can then be deposited on top of the partially wired structure according to the methods of this invention. A masking step can be performed on the dielectric layer to etch multiple small openings or contacts down to a first level metal. A second layer of conductive circuitry can then be formed above the dielectric material with connections between the layers being created by addition of conductive materials within the holes (also known as vertical vias). The steps of deposition and etching can be repeated to compose further multi-level interconnect structures.

BRIEF DESCRIPTION OF THE FIGURES

FIG. 5A is a fourier transform infrared (FTIR) spectrograph of the template polystyrene nanospheres;

FIG. 5B is a FTIR spectrograph of the continuous film consisting of the template of polystyrene nanospheres and the interstitial spaces filled with CVD OSG;

FIG. 5C is a FTIR spectrograph of the porous OSG film resulting from the decomposition of the polymer beads upon annealing;

DETAILED DESCRIPTION OF THE INVENTION

Figure 1:
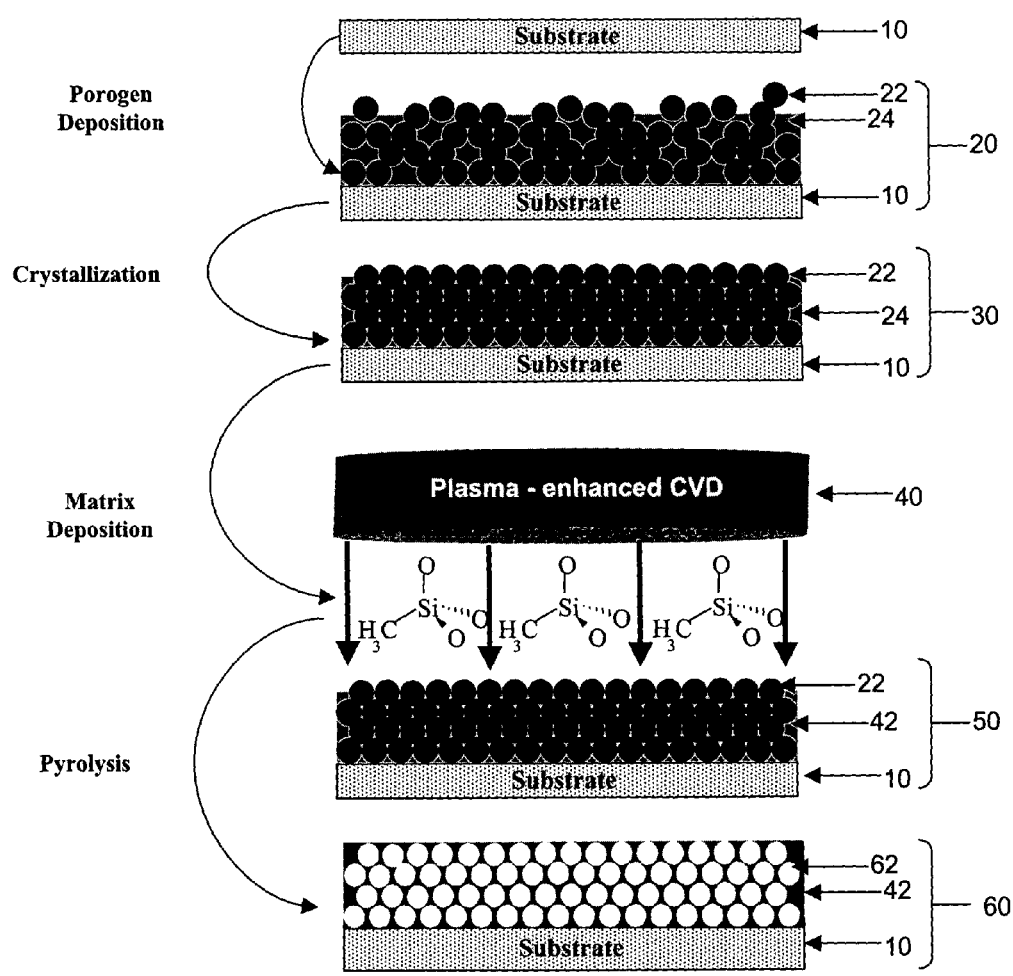
FIG. 1 depicts a schematic diagram showing the process of forming a nanoporous film by chemical vapor deposition (CVD) onto a colloidal crystal template using a sequential method of porogen and matrix deposition.

The present invention provides methods for forming porous films. The invention provides a method for rapid, large area colloidal crystallization of a porogen. In addition, methods for the incorporation of a polymeric porogen template into a CVD film is disclosed. Following the depolymerization of the polymeric template, nanoporous films with extremely low dielectric constants result. The methods of the invention can be used to make low dielectric films, porous organosilicate glass films, porous ceramics, or porous metals. The practice of the present invention employs, unless otherwise indicated, conventional methods of organic chemistry and polymer chemistry.

So that the invention is more clearly understood, the following terms are defined:

The term "polymer" as used herein refers to a large molecule built up by the repetition of small, simple chemical units, monomers, formed in an association reaction in which many molecules come together to form one large molecule. The length of the polymer chain is specified by the number of repeat units in the chain. The resulting polymer can have more than one type of repeating monomer.

The term "substrate" as used herein refers to a material having a higher melting temperature than the porogens used. The melting temperature of the substrate is at least about 300° C., preferably above 350° C., and more preferably above 400° C., and most preferably above 450° C. Suitable substrates comprise, but are not limited to, silicon, silicon dioxide, silicon-germanium, glass, silicon nitride, ceramics, aluminum, copper, and gallium arsenide.

The term "precursor" as used herein refers to a chemical which can be converted into the desired solid material but which itself is either a gas or vapor or easily converted into a gas or vapor at a modest temperature.

The term "porogen" as used herein refers to a pore forming material that is degradable and which upon heating to the material's decomposition temperature will decompose and diffuse. The porogen decomposition temperature should be sufficiently high to permit standard film preparation yet below the transition temperature of the surrounding matrix. Porogens should have a decomposition temperature of at least about 200° C., preferably above about 300° C., more preferably above 350° C., and most preferably above 400° C.

The present invention allows for rapid deposition and maximum packing density of the porogens such that highly porous materials can be produced according to the methods of the present invention. Porogens are pore forming materials having a lower decomposition temperature than the surrounding matrix, such that upon heating the porogens decompose resulting in the formation of pores. Porogen decomposition can efficiently be accomplished through heating, annealing, irradiation by photons or electrons, volatilization, sublimation, or exposure to a plasma. Any labile organic polymer, preferably with a diameter less than 100 nm, can be used as a porogen. The material used for the porogen depends upon the desired product. Polymeric porogens, such as polymethylmethacrylate, polyalphamethylstyrene, and polystyrene, are preferred. Suitable porogens comprise decomposable polymers, including not only linear, branched and crosslinked polymers and copolymers, but also crosslinked polymeric nanoparticles with reactive surface functionality. Preferably, the porogen is a polymer comprised of monomer units selected from the group consisting of styrene, halogenated styrene, hydroxy-substituted styrene, lower alkyl-substituted styrene, acrylic acid, acrylamide, methacrylic acid, methyl acrylate, ethyl acrylate, butyl acrylate, polyacrylate, ethylene oxide, propylene oxide, poly(methyl methacrylate) (PMMA), polystyrene and poly(alpha-methyl styrene) and combinations thereof. Additional polymers that may serve as the porogen herein include, but are not limited to, aliphatic polycarbonates such as poly(propylene carbonate) and poly(ethylene carbonate); polyesters; polysulfones; polylactides; polylactones. The porogen may be a homopolymer, or it may be a copolymer comprised of any of the foregoing monomeric materials, e.g., poly(styrene-co-alpha-methyl styrene), poly(styrene-ethylene oxide), poly(ether-lactones), poly(ester-carbonates), and poly(lactone-lactides).

The porogens can be dispensed rapidly. The speed of deposition of the porogens as well as the continuity of the spray can be adjusted to achieve the porosity desired. The spray can be continuous or intermittent. By varying the feed rate of the porogens with respect to the growth rate of the matrix material, the degree of porosity can be systematically varied starting from only a few percent and increasing to the maximum packing density of the porogens.

Porogens can vary in shape and size depending upon the use of the resultant porous film. Non-limiting examples include spherical, circular, planar, linear, cone-shaped, triangular, rectangular, pentagonal, hexagonal, octagonal, or irregular shaped. In a preferred embodiment, nanosphere porogens or beads are used. Porogens can be made using techniques known in the art or purchased in a colloidal aqueous solution from manufactures such as Interfacial Dynamics Corporation (Portland, Oreg.). Porogens are suspended in an aqueous solution that may contain alcohol or a surfactant, such as an amidine or sulfate, to hold the beads in suspension. Beads may be purchased in varying concentrations, for example, 4–8% solids, and can be diluted with distilled water or concentrated as desired. The size of the porogen used will depend upon the use of the resultant porous film. For example, porogens can be used with diameter less than 500 nm, more preferably with diameter less than 150 nm, more preferably with diameter less than 100 nm, more preferably with diameter less than 75 nm, more preferably with diameter less than 65 nm, more preferably with diameter less than 50 nm, more preferably with diameter less than 30 nm, more preferably with diameter less than 20 nm, more preferably with diameter less than 15 nm, and most preferably with diameter less than 10 nm. The use of porogen beads having a monodisperse size distribution results in a size distribution of the resulting material pores that will also be monodisperse.

Porogen concentrations can be varied depending upon the degree of porosity desired. To enable three-dimensional crystal templates to form on substrate areas larger than 10 $cm^2$, a rapid evaporation-induced self-assembly of labile polystyrene (PS) nanospheres from a colloidal suspension is also provided by the invention. An ultrasonic atomizer can be used to deposit the porogens and can accommodate up to 30% solids. Porogen concentration used can range from about 50 ppm to about 30% by weight solids, preferably from about 0.0001–10%, more preferably from 0.0002%–1% and most preferably from about 0.0005–0.05% by weight solids. The use of an ultrasonic atomizer for deposition of the porogens allows the process to operate with pressureless delivery as well as prevents coagulation of the porogens so that individual particles can be deposited on the substrate. In addition, the atomizer allows porogen deposition to be done under vacuum without heating of the substrate, in contrast to when the porogens are distributed onto a heated substrate at atmospheric conditions. The vacuum conditions used with the ultrasonic atomizer vaporize the water and thus enhances porogen crystallization.

The invention also provides a method of porogen dispersion that enables rapid, large area colloidal crystallization of polymeric porogens. First, an aqueous suspension of the polymer porogens is diluted and dispensed over the surface of a substrate. This can be accomplished using an ultrasonic atomizer, a syringe or spin coating of the suspension. Thermal gradient heating of the substrate can be used to crystallize the porogens. Two opposing edges of the substrate are heated. The polymer suspension of porogens at the two heated edges dry and crystallize first. Then, the two crystal domains propagated towards the cooler center of the wafer. Colloidal crystallization can yield either two or three dimensional crystals of polymeric porogens onto a substrate. This method can be used to rapidly produce large arrays containing multiple layers of polymer beads and eliminates the need to covalently link the porogen to the substrate. Thus, the present invention overcomes the limitations of conventional techniques. For example, the inefficiencies associated with HF etching of spheres and the possible damage of the CVD material by the etchant are eliminated by employing porogens of a thermally labile polymer instead of a material such as opal.

Figure 2:
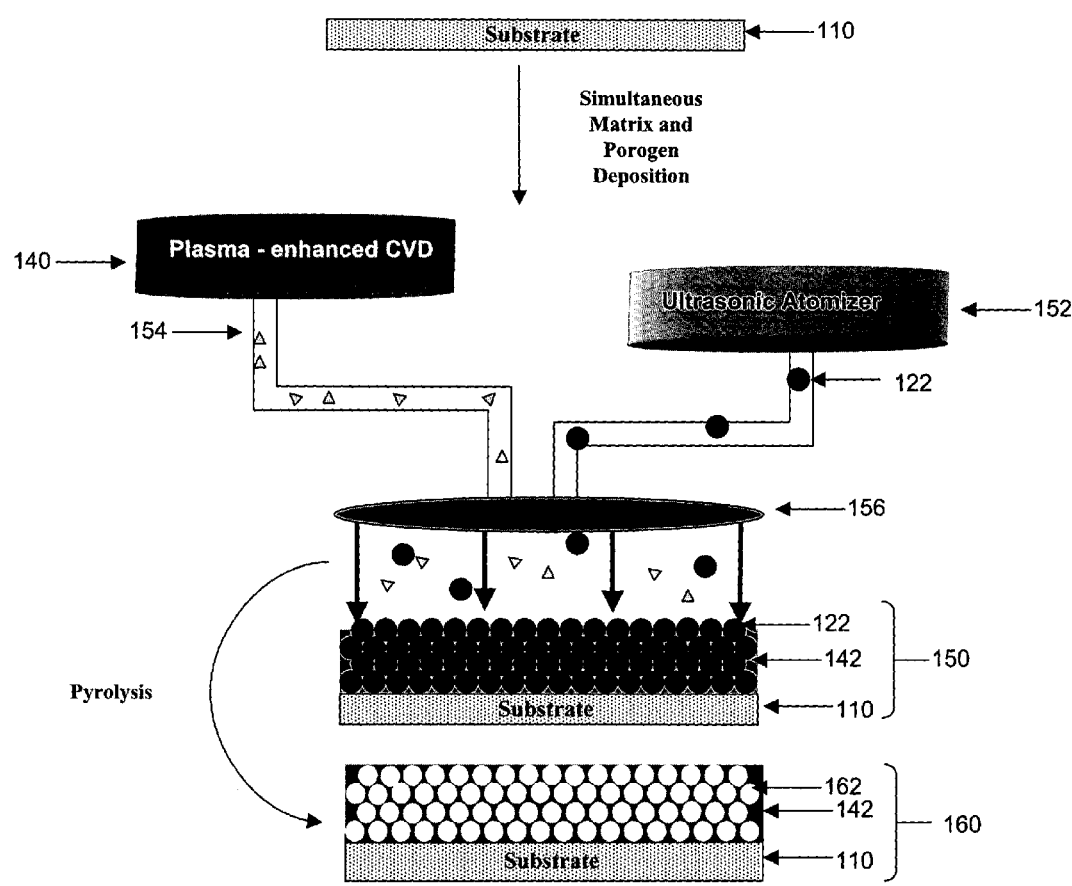
FIG. 2 depicts a schematic diagram showing the process of forming a nanoporous film by chemical vapor deposition (CVD) onto a colloidal crystal template using a simultaneous method of porogen and matrix deposition.

A material can be deposited in the interstices of the porogens either following colloidal crystallization, as shown in FIG. 1, or during colloidal crystallization, as shown in FIG. 2. In one embodiment, CVD is used to deposit the material into the open spaces between the deposited porogens. A CVD apparatus consists of several basic components including a gas delivery system, reactor chamber where deposition takes place, a substrate loading mechanism for introducing and removing substrates, an energy source to provide the energy required to get the precursors to react/deposit, a vacuum system for removal of all other gaseous species other than those required for the reaction/deposition, an exhaust system and/or exhaust treatment system to remove volatile by-products from the reaction chamber, and process control equipment such as gauges and controls to monitor process parameters such as pressure, temperature and time. CVD processing conditions are well known in the art. For certain applications, a gas flow rate between about 20–100 sccm, a liquid flow rate between about 100–5000 microliter/min, a chamber pressure between about 3–5 Torr, and temperature between about 20–30° C. can be used.

In another embodiment, plasma enhanced CVD (PECVD) is used to deposit the material to fill the open spaces between the porogens to form a structure with embedded porogens. Plasma enhanced CVD (PECVD) is a CVD process that utilizes a plasma to enhance chemical reaction rates of the precursors. PECVD processing allows deposition at lower temperatures, which is often critical in the manufacture of semiconductors with lower melting points than silicon substrates. PECVD has allowed electronic circuits to be deposited on glasses as well as flexible plasic substrates with melting temperatures below 150° C. Precursor components (often diluted in carrier gases) are delivered into the reaction chamber at approximately ambient temperatures. As they pass over or come into contact with a heated substrate, they react or decompose forming a solid phase which and are deposited onto the substrate. The substrate temperature can influence the reactions that will take place. Methods and materials used for PECVD and CVD deposition of nonporous low dielectric constant material are well known in the art and can be adapted for use in the present invention (See, for example, U.S. Pat. No. 6,410,463, which is hereby incorporated by reference).

In one embodiment, the plasma excitation timing can be continuous. In a preferred embodiment, the plasma excitation timing can be pulsed. Control of the pulse excitation timing has been shown to be effective in tuning the composition and dielectric properties (C. B. LaBelle et al. *J. Vasc. Sci. Technol*. A 17, 3419 (1999) and Wu et al. *J. Vac. Sci. Technol*. A 21(2) (2003)). The power can used can be varied depending upon the precursors used. In a preferred embodiment, a peak rf power between about 100 W and 400 W can be used for a 4 inch diameter substrate. For example, in continuous-wave runs, 100 W and 56 W of power can be applied continuously for the duration of the run. For pulsed-PECVD runs, a peak rf power of 120 W can be applied during on-time excitation. Power modulation can be achieved using a pulse generator. On times can be varied from 10 to 100 ms, while off times can vary between 0 to 1200 ms.

Materials are deposited from the gaseous state during CVD. Thus, precursors for CVD processes must be volatile, but at the same time stable enough to be able to be delivered to the reactor. Generally precursor compounds will only provide a single element to the deposited material, with others being volatilized during the CVD process. However sometimes precursors may provide more than one. Such materials simplify the delivery system, as they reduce the number of reactants required to produce a given compound.

The CVD matrix material composition can be varied to meet requirements of a particular application and to broaden the scope of envisioned microelectronics and microphotonics applications. For example, high density CVD OSG films with a composition of $Si_wC_xO_yH_z$ are known to be characterized by low dielectric constants, in the range of 2.5–2.7. Such a composition can be employed as the matrix material in the process of the invention for fabricating porous films having even lower dielectric constants. Such films also possess an extremely low refractive index.

In one embodiment OSG precursors can be used. The most common precursor for silicon and related compounds is silane, $SiH_4$. Disilane, $Si_2H_6$, is a larger molecule and thus less volatile; its boiling point is −14° C., so it can be liquefied under pressure at room temperature. Another common precursor molecule is dichlorosilane, $SiH_2Cl_2$. The larger chlorine atoms have higher electron density than hydrogen, making this molecule less volatile, with a boiling temperature of 8° C. In a preferred embodiment, dimethylsilane (2 MS) is used as the precursor. In addition to the various silanes above, precursor molecules in which oxygen-silicon bonds already exist, such as TEOS, $Si(OC_2H_5)_4$, can be used. This material has a larger surface area due to the four ethyl ($C_2Hs$) groups on the outside; the vapor pressure of TEOS is only around 5 Torr at room temperature, with a boiling point of about 160° C. The organic groups in OSGs invariably take the form of tetravalent silicon with a wide range of alkyl and alkoxy substitutions. In OSG films, the silicon-oxygen network seen in glass is occasionally interrupted, in a more or less homogeneous fashion, by the presence of organic, typically methyl ($CH_3$) groups. Hydrido (H) substitution at silicon can also be present. The film's lower dielectric constant is due to these changes to the $SiO_2$ network and the reduced density of the OSG film relative to $SiO_2$. In typical CVD low-k films, 10% to 25% of the silicon atoms are substituted with organic groups. OSG precursors include, but are not limited to, silane, acyclic and cyclic siloxanes, acyclic and cyclic silanes, cyclic organosiloxanes, alkyl, alkenyl, or alkoxy substituted silanes, alkyl and alkoxy silanes, alkylated (methylated) derivatives of silane ($SiH_4$), such as methylsilane $(CH_3)SiH_3$, dimethylsilane $(CH_3)_2SiH_2$, trimethylsilane $(CH_3)_3SiH$ and tetramethylsilane $(CH_3)_4Si$, $Si_2(CH_3)_nH_{6-n}$ (n=1–6), $C_6F_n$ (n=6–12), $C_nF_{2n+2}$ (n>1), $CH_nF_{4-n}$(n=1–4), $Si_xF_{2x+2}$(x=1–4), $SiH_nF_{4-n}$ (n=1–4), $Si_nH_{2n+2}$(n=1–3), $Si(OC_nH_{2n-1})_4$ (n=1–2), $SiH_2Cl_2$, TEOS, $Si(OC_2H_5)_4$ and derivatives thereof.

CVD precursor reagents can be synthesized or purchased. Common CVD precursors include, but are not limited to, halides, such as $TiCl_4$, $TaCl_5$, $WF_6$, hydrides, such as $SiH_4$, $GeH_4$, $AlH_3(NMe_3)_2$, $NH_3$, metal organic compounds, such as tantalum ethoxide, $Ta(OC_2H_5)_5$ and tetra dimethyl amino titanium (or TDMAT), metal alkyls, such as $AlMe_3$, $Ti(CH_2tBu)_4$, metal alkoxides, such as $Ti(OiPr)_4$, metal dialylamides, such as $Ti(NMe_2)_4$, metal diketonates, such as $Cu(acac)_2$, metal carbonyls, such as $Ni(CO)_4$, and complexes or ligands. CVD precursors can be purchased, for example, from Schumacher, a business unit of Air Products and Chemicals, Inc. and Dow Corning Corp. Dow Corning Corp. sells a variety of multifunctional silicon source liquids specifically designed for advanced PECVD processes used to deposit thin film dielectrics such as Z3MS (Trimethylsilane), Z2DM (dimethyldimethoxysilane), Z4MS (tetramethylsilane), and ZTOMCATS (tetramethylcyclotetrasiloxane). In addition, CVD precursors are well known in the art (see, for example, "CVD of Compound Semiconductors: Precursor Synthesis, Development and Applications" by Anthony C. Jones, Paul O'Brien, October 1999).

In another embodiment, ceramic precursors are used. Ceramic compounds include, but are not limited to oxides, such as $ThO_2$, $HfO_2$, $ZrO_2$, $Y_2O_3$, $Al_2O_3$, $SiO_2$, nitrides, carbides, borides, and silicides. The five highest melting point materials are hafinium carbide (HfC), tantalum carbide (TaC), carbon (C) which sublimes, zirconium carbide (ZrC), and niobium carbide (NbC). In addition, they are hard, wear resistant, chemically inert and resistant and nearly impervious to hydrogen to temperatures exceeding 3000K. Ceramic precursors are well known in the art and can be found in articles and text books such as "Ceramic Fibers and Coatings: Advanced Materials for the Twenty-First Century" Committee on Advanced Fibers for High-Temperature Ceramic Composites, National Research Council, 1998. For example, hydridopolycarbosilane and methyltrichlorosilane (MTS) are precursors of silicon carbide.

In yet another embodiment, metal precursors are used, such as organometallic materials. Methods of metal-organic chemical vapor deposition (MOCVD) and metal precursors are well known in the art, (see, for example, "The Chemistry of Metal CVD"Edited by: Toivo T. Kodas and Mark J. Hampden-Smith; Hardbound; John Wiley & Sons, Inc.; 1994, Manasevit, H. Appl. Phys. Lett. 1968, 12, 156.). The most common precursor for deposition of tungsten is tungsten hexafluoride, $WF_6$. The boiling point of $WF_6$ is about 17° C.: it is a highly volatile liquid at room temperature. In addition, Roy G. Gordon's group of Harvard University has synthesized volatile liquid precursors for over 30 metals, including main group elements (Li, Na, K, Mg, Ca, Sr, Ba, Al, In, Sn, Pb, Bi), transition metals (Ti, Zr, Hf, V, Nb, Ta, Cr, Mo, Mn, Fe, Ru, Co, Ni, Cu, Zn), and rare earth metals (Y, La, Ce, Dy), which can be used with the present invention. Their general approach has been to add alkyl groups to the ligands in normally solid metal compounds, such as beta-diketonates or dialkylamides. In some cases, pure compounds are formed that remain liquid at room temperature. In other cases, random mixtures of several alkyl substituents are needed to maintain the liquid state. See, for example, WO0227063, WO0166816, Roy G. Gordon et al. "Vapor Deposition of Metal Oxides and Silicates" Chem. Mater., 2001, 13, 2463–2464. Metal precursors can be also purchased (See, for example, Chemat Technology, Inc. (Northridge, Calif.)).

In yet another embodiment, scaffolding precursors are used. Such precursors, include, but are not limited to, $Al_2O_3$, $In_2O_3$, $SnO_2$, ATO, ITO, $BaTiO_3$, $PbTiO_3$, PZT, and $ZrO_2$.

In addition, in accordance with the invention the fraction of porogen template employed can be varied to enable control of both the dielectric constant and the refractive index of the resulting porous matrix material. For either lower dielectric constant materials or graded refractive index films, the regularity of the pore structure is not as critical as it is for photonic crystals. However, some degree of order is understood to provide some improvement in the mechanical properties of the films.

A CVD process for producing an OSG matrix in accordance with the invention preferably satisfies three criteria. First, the high density film should be hard, because relatively soft films can collapse when the porogen template is removed. In contrast, a CVD matrix material that is mechanically robust will be characterized by spherical pores once the template is removed. Second, the CVD layer should be chemically stable. In particular, in the case of an OSG film, incorporation of Si—H bonds is undesirable as these bonds are susceptible to attack by water. Finally, the CVD process should exhibit excellent gap fill in order to deposit the matrix material into the void spaces within the multiple layers of the porogen. CVD deposition onto a porogen template is preferably extremely conformal to penetrate into all the spaces within the layers of packed porogens. The difficulty of creating the CVD matrix increases as the number of porogen layers increases, ultimately limiting the film thickness that can be made. The desired CVD process to achieve conformality would be based on neutral species having low sticking coefficient as the primary film growth species. Neutral rather than charged species are favored by reducing plasma excitation (low power, pulsed power, or remote power) or no plasma excitation, relying instead on thermal or hot filament excitation. Thus, the CVD feed gases and conditions selected preferably generate reactive species having low sticking coefficients. Conditions that enhance the sticking probability of the film-forming species and promote deposition on the top surface of the colloidal crystal are undesirable, as channels needed to fill the interstices within the template structure could then become blocked. A reactive species can be accomplished by generating a neutral species. In general, low energy plasma energy excitation, using low overall power, and pulsing can be used to generate neutral species.

Considering the advantages provided by the processes of the invention, previous conventional techniques for producing porous films, specifically of dielectric materials, relied on a process of spin casting of a solution containing a porogen polymer and the precursors to form the matrix upon curing. In this case, both the porogen and the matrix precursors must be able to be solvated or dispersed in the same liquid solution. This significantly restricts the chemical composition able to be chosen for the two components. In addition, in this process, the identity of the porogen component will determine the conditions at which pores can be formed. The matrix must be able to be formed by curing which is typically driven by condensation chemistry. An example of this is sol-gel processing to form silicon dioxide, OSG, or other metal oxides. In contrast, in the techniques provided by the invention, the chemical nature of the porogen bead and the chemical nature of the CVD matrix are completely independent of one another. Additionally, the composition of the matrix can fall outside those achievable from solution chemistry. One example would be metal matrix, which can deposited from organometallic CVD precursors but would be difficult to create by solution casting and curing techniques.

Following the formation of a structure with embedded porogens, the porous film is produced upon decomposition of the porogen. In one embodiment of the invention, the matrix crosslinking reaction can occur simultaneously with the porogen decomposition. In another embodiment, the crosslinking reaction of the matrix and decomposition of the porogens can occur separately. For example, a porogen with a decomposition temperature above that of the matrix curing reaction could be chosen. Alternatively, through the modulation of the annealing temperature and annealing time, the rate of porogen decomposition can be decreased while the crosslinking or curing reaction rate is increased. For example, decreasing the annealing temperature and increasing annealing time results in greater porogen removal without contributing to additional loss in thickness.

When packed in crystalline arrays, the porogen beads represent a very high percentage of the overall volume and thus allow the creation of matrices having very high degrees of porosity, such as porosity greater than 70%, preferably greater than 75%, more preferably greater than 80%. It is to be recognized that even when packed in disordered or random arrays, the beads will give a high degree of porosity. Thus, the range of porosity that can be achieved is not unlimited.

The invention provides methods for producing a porous material in which the matrix material and the porogen are deposited either simultaneously or sequentially. In the simultaneous technique, the porogens are entrained in a gas flow. The gas flow is passed over a substrate along with precursor gases selected for producing the matrix material composition. The porogen flow configuration and electrical biasing of the substrate electrostatic clamping are selected to attract the porogen beads to deposit on the substrate. Although in this method porogens are unlikely to self assemble in a crystalline array, the method is particularly attractive for its ability to deposit the porogen simultaneously with the matrix material.

With simultaneous introduction of the porogen beads during a CVD process, conformality of deposition is no longer required. Hence the process window for deposition is much wider and this condition no longer restricts the maximum film thickness that can be achieved.

FIG. 1 depicts an exemplary embodiment of the methods of the present invention in which sequential steps are used to deposit an array (20) of porogens (22) on a substrate (10) forming an array (20) of porogens (22) surrounded by open spaces (24) on a substrate (10), crystallizing the porogens (22) such that the porogens (22) are densely packed (30), depositing a material from a vapor phase to fill open spaces (24) between the porogens (22) to form a structure (50) with embedded porogens (22) and inducing decomposition of the porogens (22) creating a nanoporous structure (60) comprising voids or pores (62) surrounded by the deposited material (42). A substrate (10) is selected from the group consisting of silicons, silicon dioxides, silicon-germaniums, glasses, silicon nitrides, ceramics, aluminums, coppers, or gallium arsenides. In a preferred example the substrate (10) can be silicon. Porogens (22) can be deposited onto the substrate (10) using spray deposition. In one embodiment an ultrasonic atomizer is used to deposit the porogens (22). Alternatively, the porogen deposition step can be accomplished using a syringe or spin-on methods. The porogen (22) is selected to have a lower decomposition temperature than the surrounding resultant matrix as described above. As shown in FIG. 1, the porogens (22) are deposited forming a noncontinuous matrix of porogens with open spaces (24) interspersed throughout the matrix. Following a crystallization step, the porogens (22) can form well-ordered arrays (30) comprising a densely packed structure. Crystallization can be accomplished utilizing gradient thermal heating. Alternatively, by adjusting the crystallization conditions, a random order of porogens (22) may result. Deposition of the matrix can be performed using CVD or plasma enhanced CVD. Chosen precursors are deposited filling in the open spaces (24) surrounding the porogens (22) with matrix material (42). FIG. 1 depicts a preferred precursor in the formation of OSG low dielectric films, dimethylsilane. Following a decomposition step, such as pyrolysis, the porous film (60) is formed as the porogens (22) decompose and their components disperse leaving a void or pore (62) in the surrounding matrix material (42).

In another embodiment, the steps of depositing the porogens and depositing a material from the vapor phase can be done simultaneously as depicted in FIG. 2. In one exemplary embodiment, an ultrasonic atomizer (152) is used to deposit the porogens (122) and a plasma enhanced CVD apparatus (140) is used to deposit the precursor reagents (154) onto the substrate (110) at the same time. A spraying element (156) can be used to dispense the porogens (122) and the precursors reagents (154). Alternatively, separate spraying elements can be used. In one embodiment, the substrate can be heated to catalyze crystallization of the porogens (122) onto the substrate (110). In another embodiment, the substrate (110) is not heated. The precursor gases fill the open spaces between the porogens (122) forming a matrix (142). Following the formation of the continuous film (150) with embedded porogens (122), a decomposition step, such as pyrolysis, is performed to decompose the porogens resulting in a porous film (160) comprising voids or pores (162) surrounded by the matrix (142). This system enables the porogens (122) and the precursor reagents (154) to be deposited under the same conditions.

It is contemplated that an apparatus for producing porous low dielectric materials would comprise a process chamber, a substrate holder within the chamber, a porogen depositing element deposed within the chamber and configured for depositing a quantity of porogens onto a substrate, and a dielectric material depositing element configured for depositing a quantity of dielectric material onto a porogen-laden substrate such that the dielectric material covers the porogens and fills gaps between the porogens to form a matrix of dielectric material, such that upon decomposition of the porogens a porous low dielectric material is obtained. In one embodiment, the porogen depositing element is a spraying element, such as an ultrasonic atomizer. In another embodiment, the dielectric material depositing element can be a CVD apparatus. In yet another embodiment, the dielectric material depositing element is a plasma enhanced CVD apparatus.

The invention also permits synthesis of templated nanoporous CVD organosilicate glass (OSG) films with extremely low values of dielectric constant. Well-ordered assemblies or random assemblies of polymer porogens serve as templates for the pores. In one embodiment, the methods of the present invention can be used to form an OSG matrix with a low dielectric constant in which conformal CVD using dimethylsilane and oxygen is used to fill the interstices of the colloidal crystal to form the OSG matrix. With subsequent annealing at 300° C. to 500° C. the labile polymer beads depolymerize, resulting in a nanoporous organosilicate thin film.

As shown in the Examples, CVD experiments were conducted in accordance with the invention to produce porous OSG films of varying porosity. The degree to which the deposited OSG matrix material infiltrated the voids between the template beads was inferred from ellipsometric measurements of refractive index of the composite film. The substrate temperature, vapor pressure, and peak rf power of the CVD OSG process were varied between 25° C. to 100° C., between 200 to 110 mTorr and between 200 to 120 W, respectively, resulting in films with degrees of infiltration of a porogen template ranging from 0% to 100%. The degree of infiltration was observed to increase with increasing substrate temperature, decreasing vapor pressure, and decreasing plasma power. The highest degree of infiltration was achieved using pulsed plasma enhanced CVD from dimethylsilane (2 MS) at 4 sccm mixed with argon at 15 sccm and oxygen at 2.5 sccm at a total pressure of 110 mTorr.

Example 3 demonstrates that thermal treatment can be employed to remove a template of porogens from a composite film once the film matrix is deposited. Polystyrene porogens, which decomposes at temperatures above 280° C., are used as the porogen in Example 3. In experimental testing of the process of the invention, decomposition of polystyrene beads was accomplished by annealing in a $N_2$ ambient, ramping the temperature at approximately 8° C./min. A ramp to 500° C. followed by isothermal anneal at 500° C. for one hour resulted in complete removal of the polymer beads. A ramp up to 300° C., an 1 hour isothermal anneal at 300° C. for 1 hour, and a ramp up to a final temperature of 500° C. also proved successful. However, the latter was more successful at removing polymer beads in thick film.

Control over the pore size is critical for obtaining materials with suitable properties for different insulator feature sizes in microelectronic devices. In accordance with the invention, to obtain different pore sizes in the nanoporous organosilicate glass, templates were assembled using polystyrene beads of 96 nm, 19 nm and 15 nm mean diameter as shown in Example 4.

The methods of the invention allow for control over both the percent porosity as well as the film thickness. Example 5 demonstrates the ability to vary the thickness of the films by adjusting the flow rate and percent of porogens. Longer depositions resulted in different thickness overcoats of dense OSG material on top of the composite layer.

The invention provides a method for making a highly porous film with low dielectric constant. This invention provides a method that maximizes the packing density of the porogen templates, thus upon decomposition of the porogen a highly porous film results. While the technique allows for control over the resultant porosity of the films by varying both the size of the porogen and density of packing, films of porosity greater than 75% are preferred. This method can be used to produce dielectric films with extremely high porosity and corresponding low dielectric values, for example, less than 2.7, preferably less than 2, more preferably less than 1.7, more preferably less than 1.5, most preferably less than 1.4. Example 3 demonstrates that the porogens can be completely decomposed resulting in a nanoporous film with extremely low values for the refractive index, 1.067, and dielectric constant, 1.4. These values can be altered depending upon the porosity of the resultant film.

In addition, films with extremely low refractive index, e.g., less than 1.07 can be produced using the method of the present invention. Thus, the present invention can be used to provide anti-reflection coatings on a flat, textured or contoured surface, e.g., coating on glass or polymeric optical surfaces, to reduce reflective loss. Most glass and plastic optical elements have a refractive index between 1.45 and 1.7. However, to be effective as an anti-reflection coating the refractive index should be much lower, less than 1.2.

The size and distribution of the porogens can also be varied. It is recognized that for semiconductor use, the pore size is optimally small compared to the feature size of the integrated circuit. Thus, nanoporosity is preferred. The ability to incorporate a nanosphere template as provided by the invention represents an evolutionary pathway to achieving CVD films with dielectric constants less than 2.0 while meeting integration requirements. Porogens of uniform size or varied size can be induced to self assemble in a crystalline array. By using porogens with a monodisperse size distribution, the size distribution of the resulting pores will also be monodisperse. Pores of uniform size are desirable in many different situations. For example, in microelectronics, all pores must be much smaller than the feature size of the circuit because a very large pore would create a defect in the structure and render the circuit useless. In optics, many effects are due to interference and thus features of uniform size and in a regular arrangement are needed to create devices for a narrow bandwidth of wavelengths. In catalysis, the kinetics of reaction and rate of mass transport are influenced by pore structure. The great value of zeolite catalysts derives from their uniform distribution of nanopores.

The methods provided by the invention lend themselves to a wide range of applications. For example, porous metal films for filtration applications and as high surface area electrodes for electrochemistry can be manufactured in accordance with the invention. Porous ceramic films, such as carbon-carbon, carbon-silicon carbide, silicon carbide-silicon carbide composites, aluminum oxide, silicon dioxide, and cerium oxide, for catalyst supports and membranes can also be produced. Porous silicon oxide and OSG films for low dielectric constant materials for microelectronics produced in accordance with the invention have particular advantages, as discussed above. High refractive index materials, with ordered and uniform pores produced by the methods of the invention can be employed for optical gratings and filters. In addition, an ultra-low dielectric material formed using the methods of the present invention can be used as an insulator in an electronic structure. For example, an electronic structure can have multiple conductor layers comprising at least one ultra-low dielectric insulator with a network of porogen-induced nanopores in electrical communication with at least one of the conductor layers.

In addition, porous calcium hydroxyapatite scaffolds can be produced with the methods of the invention for supporting bone and dental growth, and similarly, porous scaffolds can be produced for tissue growth. Porous semiconductors such as silicon, silicon carbide, or gallium arsenide can be employed for a wide range of electronic applications; the electron transport properties of these materials are altered by the finite dimensions of pore walls. In the case of porous silicon produced by electrochemical etching, the resultant material is a direct bandgap semiconductor capable of photoluminescence. In its dense form, silicon is an indirect bandgap semiconductor. Further applications of porous materials produced in accordance with the method of the invention include gas storage adsorbents, battery and capacitor electrodes, high surface-area supports for catalysis, surface filters and membranes, porous carbon for gas sorption, and materials for high energy physics experiments.

Due to their low refractive index, the porous thin films produced according to the methods of the present invention can be used as cladding material in optical waveguide applications in which a high degree of refractive index contrast between the core material and cladding is necessary to avoid signal loss. In addition, the ability to deposit the films on a variety of substrates and geometries as well as adjust the pore size and distribution will enable the methods of the present invention to be used to produce catalyst support systems as well as to produce coatings for a variety of applications such as wear resistance, corrosion resistance, high temperature protection, erosion protection and combinations thereof.

This invention is further illustrated by the following examples which should not be construed as limiting. The contents of all references, patents and published patent applications cited throughout this application, are incorporated herein by reference.

EXAMPLES

Example 1

Materials and Methods (i) Materials

Polystyrene beads of 96 nm, 19 nm, and 15 nm purchased as a colloidal suspension from Interfacial Dynamics Corporation (Portland, Oreg.) were used as porogens.

(ii) Methods (a) CVD

Depositions were carried out in a custom-built vacuum chamber that has been described by Pryce et al. (H. G. Pryce Lewis, D. J. Edell, and K. K. Gleason, *Chem. Mater.* 12, 3488 (2000)). Substrates consisted of 100-mm-diameter silicon wafers. Chamber pressure was controlled by a butterfly valve connected to an MKS model 252-A exhaust valve controller and was maintained at approximately 300 mTorr. Plasma excitation was achieved via a 13.56 MHz RF source and attached matching network. The plasma was capacitively-coupled, with a powered upper electrode/showerhead and a grounded lower electrode, which also acted as the substrate stage. For continuous-wave experiments, input power was varied at 200 W and 400 W. Polymerization under CW conditions resulted in a significant amount of visible gas-phase polymerization in the plasma sheath, which precipitated out of the gas phase as a fine white powder. For pulsed-plasma experiments, peak power was held constant at 400 W and duty cycle was varied. Duty cycle is expressed as a ratio of plasma on-time/total cycle time, where both numbers are given in milliseconds. Deposition times ranged between 3.5 and 10 minutes, depending upon the power conditions used.

(b) OSG Precursors

All OSG precursors were obtained from Voltaix, Inc. (N. Branch, N.J.) were volatilized in a Pyrex® (vessel and delivered to the reaction chamber through the powered showerhead assembly. Flow rate was regulated via a needle valve, and held constant at 1 sccm. Water (deionized, reagent grade, Ricca Chemical Company) was also fed through the showerhead and controlled via a needle valve. The flow rate was varied at 5, 10, and 20 sccm to determine the effect of water flow rate.

(c) FTIR

FTIR analyses were performed on a Thermo Nicolet Nexus 870 ESP spectrometer in transmission mode. Spectra were baseline corrected and typically taken at 4 cm$^{-1}$ resolution averaged over 64 scans. All spectra for direct comparison were normalized to a thickness of 1500 Å using Beer's Law.

(d) Film Thickness and Refractive Index

Film thicknesses and refractive indexes were obtained using Variable Angle Spectroscopic Ellipsometry (VASE), performed on a J. A. Woolam M-2000 spectroscopic ellipsometer with a xenon light source. Data were acquired at three angles (65°, 70°, and 75°) and 225 wavelengths, and the resulting data fit using the Cauchy-Urbach model (H. G. Tomkins and W. A. McGahan, *Spectroscopic Ellipsometry and Reflectometry: A User's Guide* (Wiley-Interscience, New York, 1999)).

Thermal stability analysis was performed using the ITS (Interferometry for Thermal Stability) apparatus as described by Cruden et al. (B. Cruden et al. *J. Electrochem. Soc.* 146, 4590 (1999)). Samples were heated to 400° C. for two hours under a nitrogen atmosphere and then quenched to room temperature and analyzed. The temperature ramp required approximately 30–40 minutes to reach 400° C.

(e) Electrical Measurements

Electrical measurements were performed using a mercury probe instrument from MDC. The mercury spot size was 790 microns, and three capacitance-voltage (C-V) measurements were performed for each sample studied. κ-values were calculated based on the average saturation capacitance values obtained, the film thickness (as determined by ellipsometry), and the mercury spot size.

(f) Mechanical Properties

Mechanical properties were measured by the MTS Nano Instruments Innovation Center in Oak Ridge, Tenn. Measurements of hardness and elastic modulus were performed using a Nano Indenter® DCM and MTS' patented Continuous Stiffness Measurement (CSM) technique. With this technique, each indent gives hardness and elastic modulus as a continuous function of the indenter's displacement into the samples. Ten indentations were performed on each sample. Loading was controlled such that the loading rate divided by the load was held constant at 0.05/sec. Experiments were terminated at a depth of approximately 500 nm. The tip used for these experiments was a Berkovich diamond tip. As a control, a sample of fused silica (amorphous $SiO_2$) was also tested. Samples were approximately 8500 Å in thickness to minimize any effect of the substrate on the measurements.

Samples were mounted for analysis by the following procedure: Crystalbond®, a low-melting-temperature wax, was used to adhere a standard microscope slide to an aluminum stub. The stub and slide were allowed to come to room temperature. Five-minute epoxy was used to adhere the test sample to the microscope slide, taking care to ensure that the test area sat over the aluminum stub.

Example 2

Large Area Colloidal Crystallization

Rapid, large area colloidal crystallization is shown in this example. An aqueous suspension of the polymer porogen nanospheres was diluted to 0.1–0.5 w/v % and dispensed over the surface of a rectangular silicon piece by a syringe. An ultrasonic atomizer model VC 134 AT from Sonics & Materials, Inc. (Newtown, Conn.) was alternatively used to deposit the porogens. The atomizer used a 40 kHz frequency to give a median drop size of 45 microns. The amplitude dial, which controls the magnitude of the vibrations at the probe tip, was adjusted so the wattmeter, which indicates the amount of ultrasonic power delivered to the probe, was around 3 watts. Two opposing edges of the rectangular substrate were heated to 60–70° C. The polymer suspension of porogens at the two heated edges dried and crystallized first. Then, the two crystal domains propagated towards the cooler center of the wafer. This method was used to produce arrays as large as 10 cm$^2$ containing multiple layers of polymer beads in less than 60 minutes.

Figure 3A:
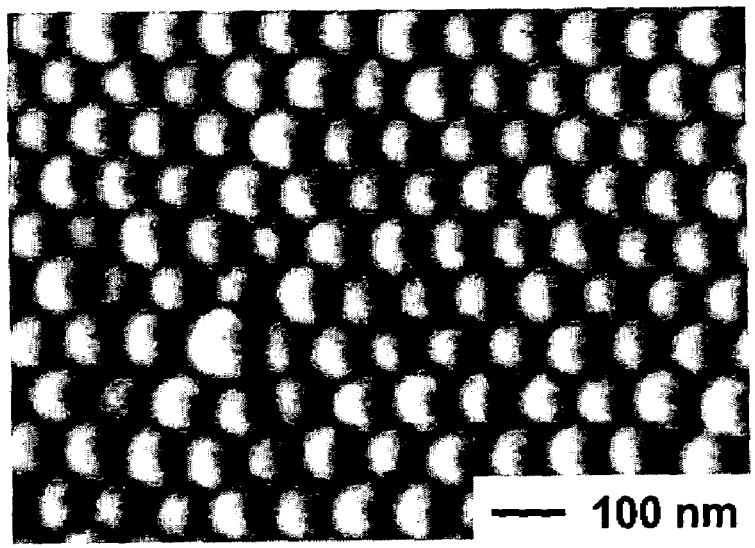
FIG. 3A depicts a top view of a scanning electron micrograph (SEM) image of a three-dimensional crystal formed from a five-layer polystyrene template assembled on a Si wafer of monodisperse polystyrene beads of 96 nm diameter.
Figure 3B:
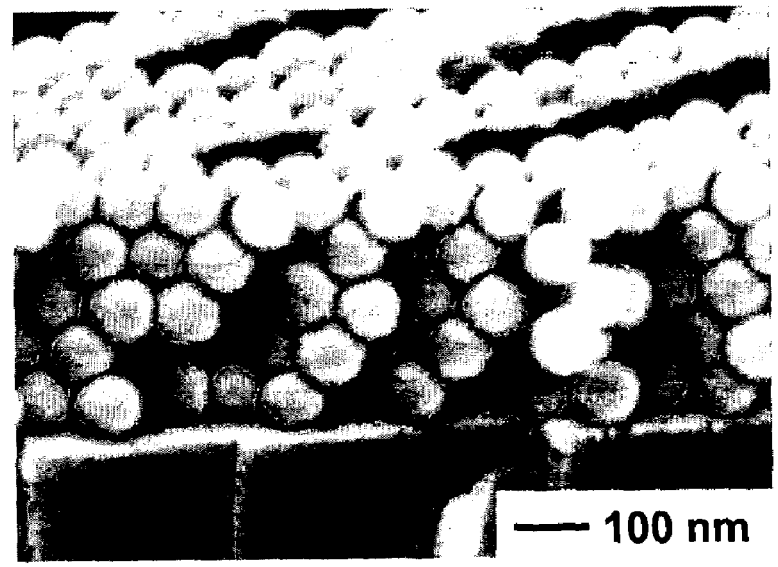
FIG. 3B depicts an oblique view of a scanning electron micrograph (SEM) image of a three-dimensional crystal formed from a five-layer polystyrene template assembled on a Si wafer of monodisperse polystyrene beads of 96 nm diameter.

FIG. 3 is a scanning electron micrograph (SEM) of a three-dimensional crystal of monodisperse polystyrene beads of 96±4 nm diameter assembled using this rapid, large-area process provided by the invention. The top down view (FIG. 3A) reveals well-ordered hexagonal arrays of the polymer beads. Five layers of beads can be seen in the cross sectional view (FIG. 3B) to have been provided by the process. In accordance with the invention, variation in the concentration of the polymer microspheres in the suspension provides precise control over the number of bead layers formed, e.g., ranging from two layers to over 15 layers. This approach is superior for its elegant simplicity, speed, and effectiveness in producing large area crystalline templates of a prespecified, reproducible, and well-defined thickness.

Example 3

Formation of Composite Films Comprising OSG and Polymer Beads

Porous OSG Films can be produced according to the methods of the invention with porogens of various sizes. The conditions, such as substrate temperature, vapor pressure, and peak RF power of the CVD process, can be modulated to control the degree of infiltration of the porogen template. The substrate temperature, vapor pressure, and peak RF power of the CVD OSG process were varied between 25° C. to 100° C., between 200 to 110 mTorr and between 200 to 120 W, respectively, resulting in films with degrees of infiltration of a porogen template ranging from 0% to 100%. The degree of infiltration was observed to increase with increasing substrate temperature, decreasing vapor pressure, and decreasing plasma power. The highest degree of infiltration was achieved using pulsed plasma enhanced CVD from dimethylsilane (2 MS) at 4 sccm mixed with argon at 15 sccm and oxygen at 2.5 sccm at a total pressure of 110 mTorr. The degree to which the deposited OSG matrix material infiltrated the voids between the template beads was inferred from ellipsometric measurements of refractive index of the composite film.

Figure 4A:
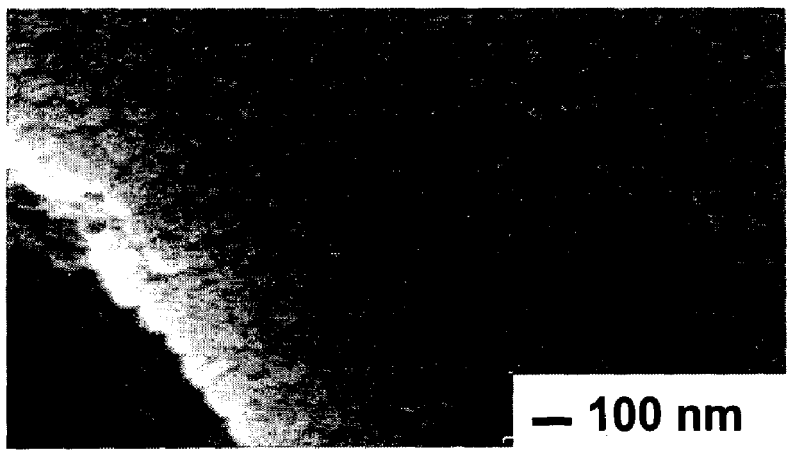
FIG. 4A depicts a scanning electron micrograph (SEM) image of composite films having an OSG matrix deposited at substrate temperatures of 20° C.
Figure 4B:
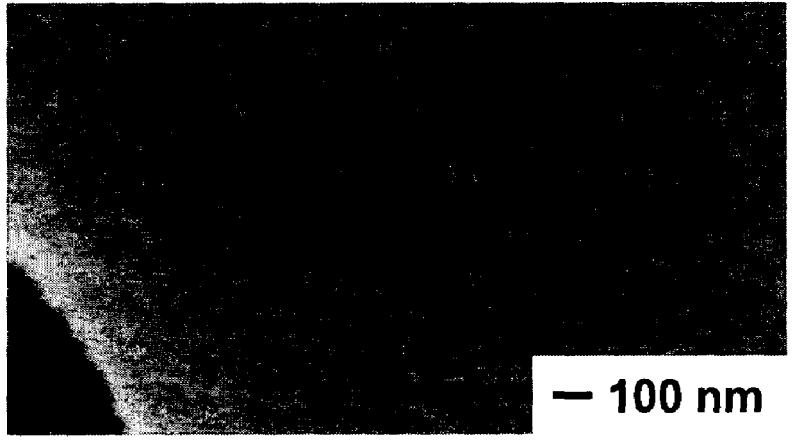
FIG. 4B depicts a scanning electron micrograph (SEM) image of composite films having an OSG matrix deposited at substrate temperatures of 95° C.

Considering the excitation cycle of a pulsed plasma CVD process, the plasma was pulsed "on" at a peak rf power of 120 W for 10 ms followed by an "off" time of 600 ms. FIGS. 4A and 4B are SEM images of two composite films each consisting of OSG and a template formed from crystalline assembly of polymer beads. The only difference in the deposition conditions was the substrate temperature. The filling of the OSG matrix at a substrate temperature of 95° C. (FIG. 4B) is found to be superior to that for a 20° C. substrate temperature (FIG. 4A). This observation is consistent with the expected decrease in the sticking coefficient with increasing temperature for an adsorption limited process. A lower sticking coefficient increases the probability that the OSG precursor is able to traverse the small channels within the template of polymer beads prior to reacting to form the film.

Example 4

Formation of Porous OSG Films: Decomposing the Porogens from the Composite Films Thermal treatment can be employed to remove a template of polymer beads from a composite film once the film matrix is deposited. In this example polystyrene beads were used as the porogens. Polystyrene decomposes at temperatures above 280° C. In experimental testing of the process of the invention, decomposition of polystyrene beads as accomplished by annealing in a $N_2$ ambient, ramping the temperature at approximately 8° C./min. A ramp to 500° C. followed by isothermal anneal at 500° C. for one hour resulted in complete removal of the polymer beads. A ramp up to 300° C., an 1 hour isothermal anneal at 300° C. for 1 hour, and a ramp up to a final temperature of 500° C. also proved successful. However, the latter is found to be more successful at removing polymer beads in thick film.

Figure 4C:
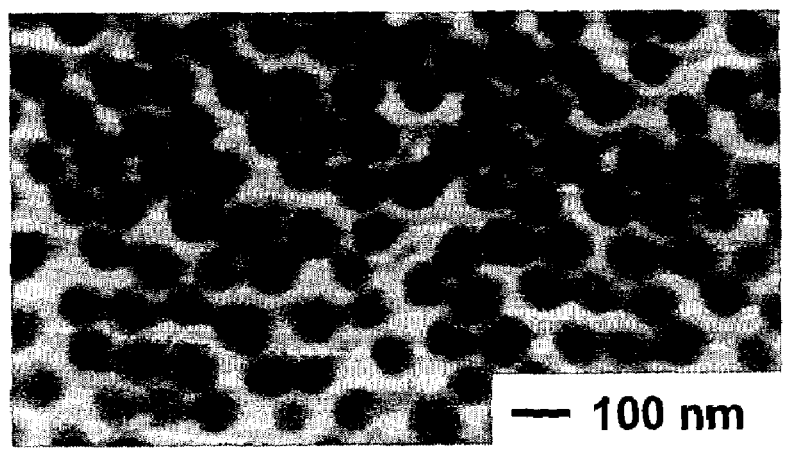
FIG. 4C depicts a scanning electron micrograph (SEM) image of the nanoporous OSG film formed using the template beads of 96 mm.
Figure 4D:
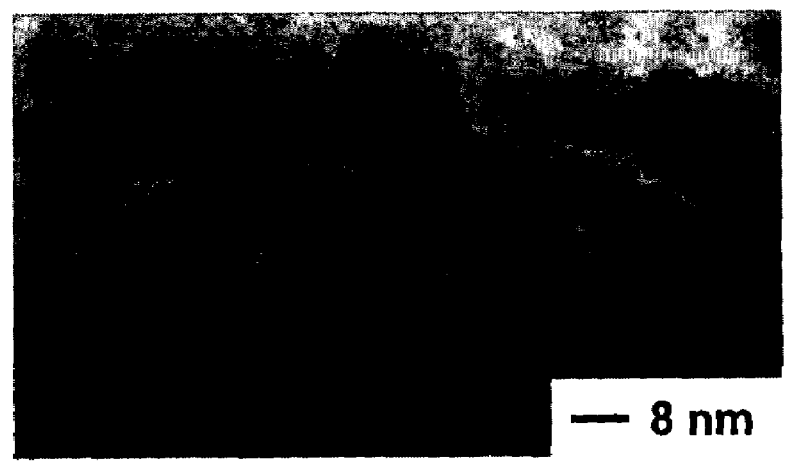
FIG. 4D depicts a transmission electron micrograph (TEM) image of nanoporous OSG film formed using the template beads of 15 nm.

FIG. 4C shows a cross-sectional SEM image of resultant nanoporous OSG film produced using 96 nm polystyrene beads. Spherical ordered pores created by the decomposition of the 96 nm beads are clearly visible in FIG. 4C. FIG. 4D shows transmission electron micrograph (TEM) image of resultant nanoporous OSG film produced using 15 nm polystyrene beads. Spherical pores created by decomposition of the 15 nm beads can be seen in FIG. 4D although pore sizes are very different due to high standard deviation of diameter for 15 nm beads. The porosity is also attested by the extremely low values measured for the refractive index, 1.067, and dielectric constant, 1.4.

FTIR spectra were taken to confirm the complete decomposition of the porogen. FIG. 5 shows the FTIR spectra of (A) the polystyrene template, (B) the template after deposition of the OSG matrix and (C) the nanoporous OSG film created by the thermal treatment. In FIG. 5A and FIG. 5B, the C—H stretch region associated with the polystyrene appears from 2844–3091 $cm^{-1}$. Additionally, FIG. 5B exhibits the $CH_3$ stretching bands from OSG centered at 2960 $cm^{-1}$. After annealing (FIG. 5C), only the 2960 $cm^{-1}$ band remains, clearly demonstrating the complete removal of the polystyrene template and retention of the OSG matrix material and porous structure.

The FTIR spectrum of nanoporous. OSG film (FIG. 5C) also contains an Si—$CH_3$ methyl rocking band at 1270 $cm^{-1}$; O-Si—O stretching bands at the region of 1040-1120 $cm^{-1}$; and $S_1$—$CH_3$ stretching bands at the region of 780-880 $cm^{-1}$. The Si—H stretching band at 2221 $cm^{-1}$ is visible in the spectrum of the composite OSG plus polystyrene template film (FIG. 5B) but not in the porous OSG film (FIG. 5C), showing removal of Si—H by thermal treatment at 500° C.

Example 5

Formation of Multi-layer Porous OSG Films of Various Pore Size and Thickness

To demonstrate the effect of varying template fraction, in accordance with the invention, three films were prepared. All used 2-layer templates of 96 nm beads and the same CVD conditions for the OSG matrix deposition. The only variable was the thickness of the OSG matrix. For the thinnest composite film, the thickness was essentially the same as the 2-layer template. Longer depositions resulted in different thickness overcoats of dense OSG material on top of the composite layer. The percentage of template in each of the three composite films was calculated assuming hexagonal packing of the 96 nm beads into a 2-layer structure and the measured thickness of the composite film.

Figure 6A:
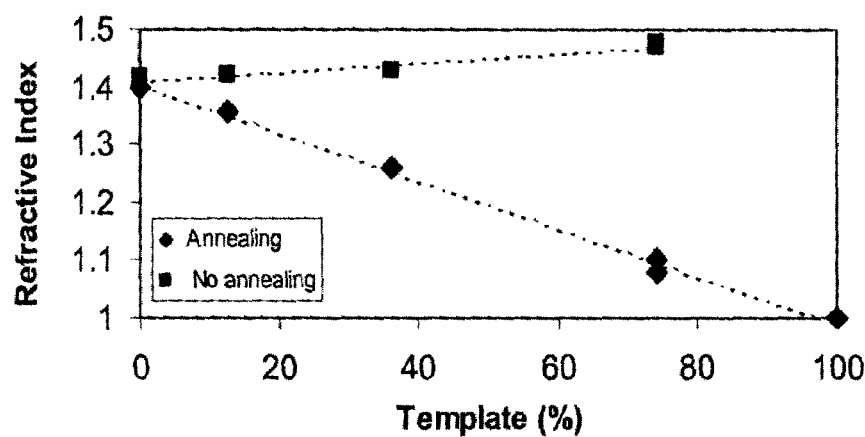
FIG. 6A is a graph of the refractive index versus % template.

FIG. 6A shows refractive index, $\eta$, at 633 nm, determined by variable angle spectroscopic ellipsometry, as a function of the % template for the three composite films. Also shown in FIG. 6A, are the refractive indices for the nanoporous OSG films created by annealing of the three composite samples as well as the 1.397 value for a dense annealed OSG film. For pure polystyrene, $\eta=1.589$ at 20° C. Thus, the linear increase of $\eta$ with % template in the composite films is consistent with the higher fraction of polystyrene. The pore spaces in the annealed films have $\eta=1$. FIG. 6A shows the expected linear decrease in refractive index with the % template, assuming complete decomposition of the polystyrene to leave pores of exactly the same dimensions. Extending the linear correlation to 100% template gives the expected value of 1 within experimental error. Note the extremely low refractive index of 1.067 resulting from annealing of the composite film with 74% template. This is understood to be the lowest reported refractive index for a porous OSG film.

Figure 6B:
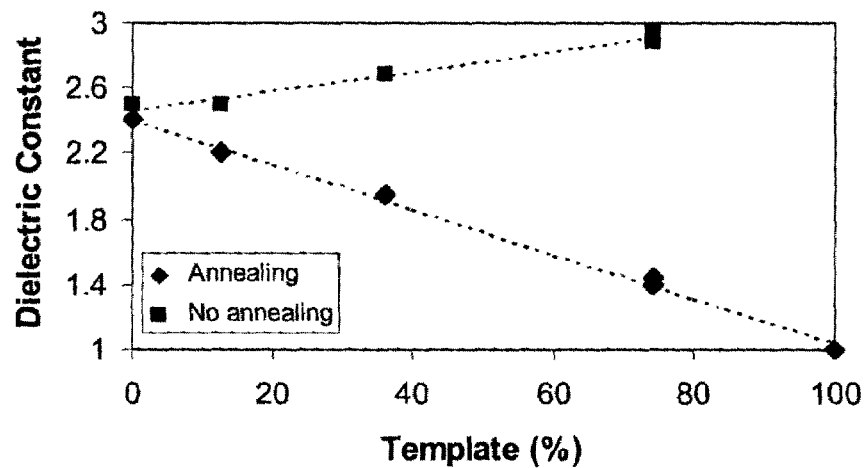
FIG. 6B is a graph of the dielectric constant versus % template.

FIG. 6B shows the dielectric constants at 1 MHz measured on a mercury probe for the same set of films described in FIG. 6A. The dielectric constant of the composite films increases with increasing % template, indicating the polystyrene has a higher dielectric constant than the OSG matrix. The decrease in dielectric constant with % template for the annealed films is attributed to the pore formation in the film. The trends in dielectric constant are the same as that observed for refractive index. An extremely low dielectric constant of 1.4 was achieved in the nanoporous OSG film fabricated using a 74% template. Within experimental error, least squares regression of the data extrapolates to the expected value of 1.0 at 100% porosity.

What is claimed is:

1. A method for fabricating a nanoporous structure, said method comprising the steps of:

depositing an array of porogens on a substrate;
crystallizing the porogens such that the porogens are densely packed;
depositing a material from a vapor phase to fill open spaces between the porogens to form a structure with embedded porogens; and
inducing thermal decomposition of the porogens.

2. The method of claim 1, wherein the step of depositing an array of porogens is performed by spray deposition.

3. The method of claim 2, wherein the step of depositing an array of porogens is performed using an ultrasonic atomizer.

4. The method of claim 1, wherein the step of depositing an array of porogens is performed using a syringe.

5. The method of claim 1, wherein the step of depositing an array of porogens further comprises applying an aqueous suspension of porogens over a surface of the substrate.

6. The method of claim 5, wherein the method further comprises utilizing spin coating to disperse the aqueous suspension over the substrate.

7. The method of claim 1, wherein the step of crystallizing the porogens further comprises thermal gradient heating of the substrate.

8. The method of claim 1, wherein the step of depositing an array of porogens comprises depositing an ordered array of porogens.

9. The method of claim 1, wherein the step of depositing an array of porogens comprises depositing a random array of porogens.

10. The method of claim 1, wherein the step of depositing an array of porogens comprises depositing porogens that are uniform in size.

11. The method of claim 1, wherein the step of depositing an array of porogens comprises depositing porogens that vary in size.

12. The method of claim 1, wherein the step of depositing an array of porogens comprises depositing porogens that have a mean diameter less than 100 nm.

13. The method of claim 1, wherein the step of depositing an array of porogens comprises depositing porogens that are selected from the group consisting of spherical, circular, planar, linear, cone-shaped, triangular, rectangular, pentagonal, hexagonal, octagonal, and irregular shaped.

14. The method of claim 1, wherein the step of depositing a material further comprises utilizing chemical vapor deposition (CVD).

15. The method of claim 1, wherein the step of depositing a material further comprises utilizing pulsed plasma chemical vapor deposition (CVD).

16. The method of claim 1, wherein the steps of depositing an array of porogens and depositing a material from a vapor phase are performed at specified flow rates, such that porosity of the nanoporous structure can be varied.

17. The method of claim 1, wherein the step of depositing a material further comprises filling the open spaces with a composition that is a liquid at room temperature and atmospheric pressure.

18. The method of claim 1, wherein the step of depositing a material further comprises filling the open spaces with a precursor reagent.

19. The method of claim 18, wherein the precursor reagent is selected from the group consisting of halides, hydrides, metal organic compounds, metal alkyls, metal dialylamides, metal diketonates, metal carbonyls, and complexes or ligands thereof.

20. The method of claim 1, wherein the step of depositing a material further comprises generating an uncharged species.

21. The method of claim 1, wherein the method further comprises establishing a rate of decomposition of the porogens.

22. The method of claim 21, wherein the step of establishing the rate of decomposition further comprises varying temperature and time of the decomposition step.

23. The method of claim 1, wherein the method further comprises selecting a porogen with a decomposition temperature above that needed to cure the material.

24. The method of claim 1, wherein the nanoporous structure has a dielectric constant less than 2.7.

25. The method of claim 1, wherein the nanoporous structure has a dielectric constant less than 2.0.

26. The method of claim 1, wherein the material is selected from the group consisting of metals, ceramics, OSGs, aluminum oxides, silicon dioxides, cerium oxides, calcium hydroxyapatites, silicons, silicon carbides, and gallium arsenides.

27. The method of claim 1, wherein the nanoporous structure has a porosity between 1% to 99%.

28. The method of claim 1, wherein the nanoporous structure has a porosity greater than 50%.

29. The method of claim 1, wherein the nanoporous structure has a porosity greater than 70% porosity.

30. The method of claim 1, wherein the material has a higher melting temperature than the decomposition temperature of the porogen.

31. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the steps of depositing an array of porogens, crystallizing, and depositing a material are repeated.

32. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the steps of depositing an array of porogens and depositing a material are completed simultaneously.

33. The method of claim 32, wherein the steps of depositing an array of porogens, crystallizing, and depositing a material are completed simultaneously.

34. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the method further comprises heating the substrate to approximately 95° C. prior to the step of depositing the array of porogens.

35. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the substrate is selected from the group consisting of silicons, silicon dioxides, silicon-germaniums, glasses, silicon nitrides, ceramics, aluminums, coppers, and gallium arsenides.

36. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the step of depositing a material further comprises using low energy plasma energy excitation.

37. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens, wherein the step of depositing a material further comprises filling the open spaces with the material, the material including at least one of a silicate, a metal, and a ceramic.

38. The method of claim 37, wherein the silicate material is selected from the group consisting of silane, acyclic and cyclic siloxanes, acyclic and cyclic silanes, cyclic organosiloxanes, alkyl, alkenyl, or alkoxy substituted silanes, alkyl and alkoxy silanes, alkylated (methylated) derivatives of silane, methylsilane, dimethylsilane, trimethylsilane and tetramethylsilane, $Si_2(CH_3)_nH_{6-n}(n=1-6)$, $C_6F_n(n=6-12)$, $C_nF_{2n+2}$ (n>1), $CH_nF_{4-n}(n=1-4)$, $Si_xF_{2x+2}$ (x=1-4), $SiH_nF_{4-n}(n=1-4)$, $SinH_{2n+2}$ (n=1-3), $Si(OC_nH_{2n+1})_4$ (n=1-2), $SiH_2Cl_2$, TEOS, and $Si(OC_2H_5)_4$, and derivatives thereof.

39. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing thermal decomposition of the porogens, wherein the method further comprises selecting porogens that are formed from materials selected from the group consisting of polystyrene, silica, styrene, halogenated styrene, hydroxy-substituted styrene, lower alkyl-substituted styrene, acrylic acid, acrylamide, methacrylic acid, methyl acrylate, ethyl acrylate, butyl acrylate, polyacrylate, ethylene oxide, propylene oxide, poly(methyl methacrylate) (PMMA), poly(alpha-methyl styrene), aliphatic polycarbonates, poly(propylene carbonate) and poly(ethylene carbonate), polyesters, polysulfones, polylactides, polylactones, and combinations thereof.

40. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the step of inducing decomposition of the porogens further comprises at least one of pyrolysis, irradiation, and curing the material.

41. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the method further comprises producing an anti-reflective coating on the substrate.

42. A method for fabricating a nanoporous structure, said method comprising the steps of:
depositing an array of porogens on a substrate;
crystallizing the porogens such that the porogens are densely packed;
depositing a material from a vapor phase to fill open spaces between the porogens to form a structure with embedded porogens; and
inducing decomposition of the porogens,
wherein the step of inducing decomposition of the porogens is performed under ambient conditions at elevated temperatures between 280° C. and 500° C.

* * * * *